(12) United States Patent
Chong (10) Patent No.: US 7,186,487 B1
(45) Date of Patent: Mar. 6, 2007

(54) METHOD OF CONTROLLING EXPOSURE PROCESSES BY MONITORING PHOTON LEVELS, AND SYSTEM FOR ACCOMPLISHING SAME

(75) Inventor: Robert J. Chong, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 579 days.

(21) Appl. No.: 10/771,109

(22) Filed: Feb. 3, 2004

(51) Int. Cl.
*G03C 5/00* (2006.01)

(52) U.S. Cl. .................. 430/30; 430/311; 250/395

(58) Field of Classification Search ............. 430/30, 430/311; 250/354.1, 372, 395
See application file for complete search history.

(56) References Cited

U.S. PATENT DOCUMENTS 5,892,222 A * 4/1999 Elabd .................... 250/226
6,710,343 B2 * 3/2004 Wood et al. ............ 250/338.1

OTHER PUBLICATIONS

Hecht, OPTICS, 2nd ed., 1987, pp. 43-45.
Lui, "Minimum Line-Width Features for Cryogenic Optical Photon Detectors," National Nanofabrication Users Network, Stanford Nanofabrication Facility, pp. 70-71.

Miller et al., "Demonstration of a low-noise near-infrared photon counter with multiphoton discrimination," *Applied Physics Letters*, 83:791-93, 2003.

* cited by examiner

*Primary Examiner*—Christopher G. Young
(74) *Attorney, Agent, or Firm*—Williams, Morgan & Amerson

(57) ABSTRACT

The present invention is generally directed to various methods of controlling exposure processes by monitoring photon levels, and various systems for accomplishing same. In one embodiment, the method comprises performing an exposure process by generating light comprised of a number of photons from a light source to expose at least a portion of a layer of photo-sensitive material, counting a number of photons incident on at least a portion of the layer of photo-sensitive material, and controlling at least one of a duration of the exposure process and an irradiance of the light source based upon the counted number of photons. In another illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, and controlling at least one of a duration of the exposure process and an irradiance of the light source based upon the determined rate of the photons impacting the layer of photo-sensitive material.

66 Claims, 2 Drawing Sheets

METHOD OF CONTROLLING EXPOSURE PROCESSES BY MONITORING PHOTON LEVELS, AND SYSTEM FOR ACCOMPLISHING SAME

BACKGROUND OF THE INVENTION

1. Field of the Invention

This invention relates generally to semiconductor fabrication technology, and, more particularly, to a method of controlling exposure processes by monitoring photon levels, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Figure 1:
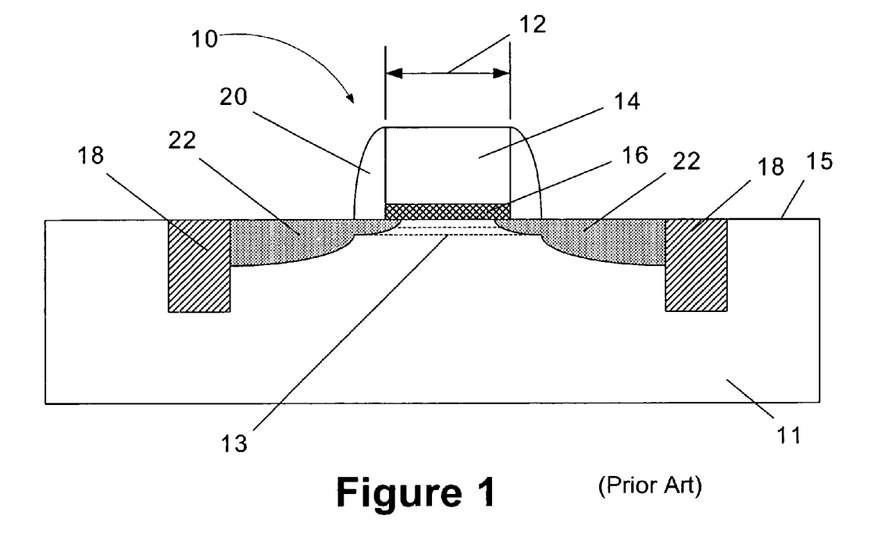
FIG. 1 is a cross-sectional view of an illustrative prior art transistor.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of semiconductor devices, such as the illustrative transistor 10 depicted in FIG. 1, are formed above a semiconducting substrate. In general, semiconductor manufacturing operations involve, among other things, the formation of layers of various materials, e.g., polysilicon, metals, insulating materials, etc., and the selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.18 μm (1800 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

Photolithography is a process typically employed in semiconductor manufacturing. Photolithography generally involves forming a photo-sensitive layer, e.g., a layer of photo-resist material (positive or negative), above one or more layers of material, e.g., polysilicon, silicon dioxide, that are desired to be patterned. Thereafter, a pattern that is desired to be formed in the underlying layer or layers of material is initially formed in the photo-sensitive layer, e.g., the layer of photoresist, using an appropriate stepper tool or phase scanner tool and known photolithographic techniques, i.e., an image on a reticle in the stepper tool is transferred to the layer of photoresist by exposing the layer of photoresist with a light source, e.g., an ultraviolet or deep-ultraviolet (DUV) light source. Then, the exposed layer of photoresist is developed so as to leave in place a patterned layer of photoresist (or photo mask) substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

More particularly, in one illustrative embodiment, modern photolithography processes generally involve the steps of: (1) applying a layer of photoresist above a wafer, typically accomplished by a spin-coating process; (2) pre-baking (or soft-baking) the layer of photo-resist at a temperature of approximately 90–120° C. to reduce the level of solvents in the layer of photoresist and to improve the adhesion characteristics of the photoresist; (3) performing an exposure process, wherein the layer of photoresist is exposed to a light source and a pattern is projected onto the layer of photoresist through a reticle used in a stepper tool to create a latent image in the layer of photoresist; (4) performing a postexposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

However, in the process of forming the layer of photoresist above a wafer, the thickness of the layer of photoresist may vary across the surface of the wafer (within wafer variations) as well as from wafer to wafer (wafer-to-wafer variations). These variations may be localized within a wafer, e.g., the photoresist material formed on an edge region of a wafer may be thicker than the photoresist material in a middle region of the wafer.

Such variations may be the result of a variety of factors. For example, the amount of photoresist initially deposited may vary, the wafer may be rotated at a speed greater or less than the desired rotational speed, the duration of the spinning process may be more or less than anticipated, and the viscosity of the photoresist material may vary as the photoresist material is consumed and replenished. Additionally, variations in cooling of the wafer prior to photoresist application and variations in the pre-exposure bake process may result in the layer of photoresist having unanticipated thickness variations.

In general, the exposure process is performed with parameters that are preselected based upon the anticipated condition of the incoming layer of photoresist, e.g., thickness, across-wafer uniformity, etc. That is, parameters, such as the exposure dose, are determined based upon anticipated conditions of the layer of photoresist, However, unanticipated variations in the layer of photoresist may adversely affect the ability to produce semiconductor devices having the desired feature size. For example, if the layer of photoresist is thicker than anticipated (either across the wafer or from wafer to wafer), a feature, e.g., a gate electrode, may be formed with a critical dimension greater than anticipated. The critical dimensions may also be smaller than anticipated, depending upon the critical dimension swing curve of the photolithography process. This situation may occur when the exposure process is performed with parameters, e.g., exposure dose, that are intended to be performed on a layer of photoresist having a lesser thickness. Conversely, if the layer of photoresist is thinner than anticipated, the resulting gate electrodes may have a critical dimension that is less than or greater than a targeted critical dimension. All of the identified problems tend to lead to inefficiencies in manufacturing operations and reduce product yields.

Moreover, in some cases, the light source used in the exposure process tends to degrade over time due to repetitive use. Such degradation may adversely impact the ability to expose the photo-sensitive layer in the desired manner. More specifically, performing an exposure process using a preselected exposure dose with a degraded light source may result in a less than satisfactory exposure process. Ultimately, such a situation may lead to reduced manufacturing efficiencies.

The present invention is directed to a method and system that may solve, or at least reduce, some or all of the aforementioned problems.

SUMMARY OF THE INVENTION

The present invention is generally directed to various methods of controlling exposure processes by monitoring photon levels, and a system for accomplishing same. In one illustrative embodiment, the method comprises performing an exposure process by generating light comprised of a number of photons from a light source to expose at least a portion of a layer of photo-sensitive material, counting a number of photons incident on at least a portion of the layer of photo-sensitive material, and controlling at least one of a duration of the exposure process and an irradiance of the light source based upon the counted number of photons.

In another illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, and controlling at least one of a duration of the exposure process and an irradiance of the light source based upon the determined rate of the photons impacting the layer of photo-sensitive material.

In yet another illustrative embodiment, the method comprises performing an exposure process by generating light comprised of a number of photons from a light source to expose at least a portion of a layer of photo-sensitive material, counting a number of photons incident on at least a portion of the layer of photo-sensitive material, determining at least one of a duration of the exposure process and an irradiance of the light source based upon the counted number of photons, and performing at least one additional exposure process on at least one additional layer of a photo-sensitive material using at least one of the determined duration of the exposure process and the irradiance of the light source.

In still another illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, determining at least one of a duration of the exposure process and an irradiance of the light source based upon the determined rate of the photons impacting the layer of photo-sensitive material, and performing at least one additional exposure process on at least one additional layer of a photo-sensitive material using at least one of the determined duration of the exposure process and the irradiance of the light source.

In a further illustrative embodiment, the method comprises performing an exposure process by generating light comprised of a number of photons from a light source to expose at least a portion of a layer of photo-sensitive material, counting a number of photons incident on at least a portion of the layer of photo-sensitive material, determining a degradation of the light source based upon the counted number of photons, and controlling at least one of a duration of the exposure process and an irradiance of the light source based upon the determined degradation of the light source.

In yet a further illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, determining a degradation of the light source based upon the determined rate of the photons impacting the layer of photo-sensitive material, and controlling at least one of a duration of the exposure process and an irradiance of the light source based upon the determined degradation of the light source.

In still a further illustrative embodiment, the method comprises performing an exposure process by generating light comprised of a number of photons from a light source to expose at least a portion of a layer of photo-sensitive material, counting a number of photons incident on at least a portion of the layer of photo-sensitive material, determining a degradation of the light source based upon the counted number of photons, determining at least one of a duration of the exposure process and an irradiance of the light source based upon the determined degradation of the light source, and performing at least one additional exposure process on at least one additional layer of a photo-sensitive material using at least one of the determined duration of the exposure process and the irradiance of the light source.

In yet another illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, determining a degradation of the light source based upon the determined rate of the photons impacting the layer of photo-sensitive material, determining at least one of a duration of the exposure process and an irradiance of the light source based upon the determined degradation of the light source, and performing at least one additional exposure process on at least one additional layer of a photo-sensitive material using at least one of the determined duration of the exposure process and the irradiance of the light source.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of controlling exposure processes by monitoring photon levels, and various systems for accomplishing same. As will be readily apparent to those skilled in the art upon a complete reading of the present application, the present invention may have application in a variety of different industries, e.g., semiconductor manufacturing, MEMS, material sciences, biotech industries, optics applications, etc. In general, the present invention may be employed in any application where a photo-sensitive layer of material is subjected to photon bombardment from any type or quality of light source. Even more specifically, in the context of semiconductor manufacturing, the present invention may be employed with a variety of different technologies, e.g., NMOS, PMOS, CMOS, etc., and it is readily applicable to a variety of devices, including, but not limited to, logic devices, memory devices, etc. Thus, the present invention should not be considered as limited to any particular industry or to any particular type or composition of a photo-sensitive layer, unless such limitations are expressly set forth in the appended claims.

Figure 2:
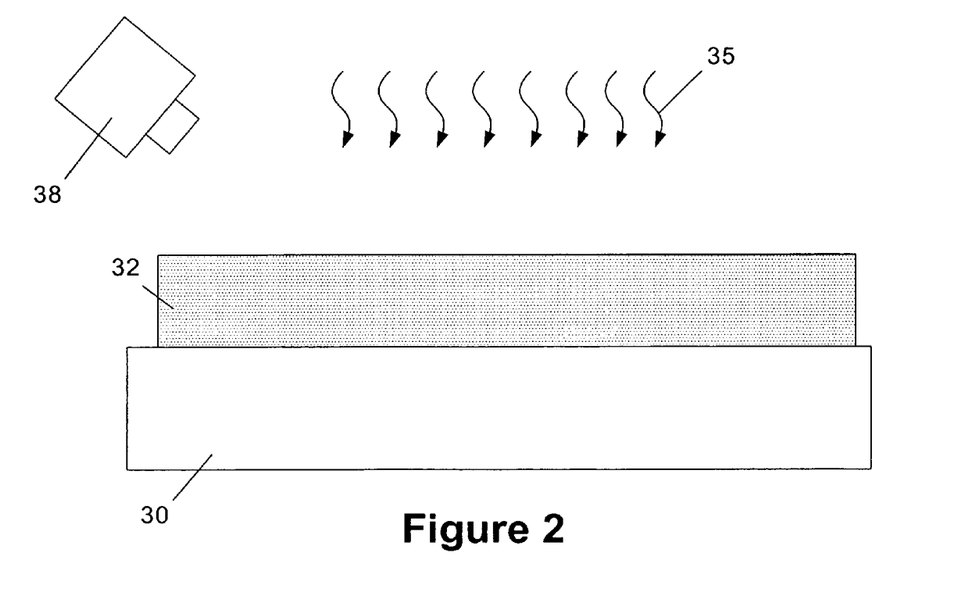
FIG. 2 is a cross-sectional view of a structure having a photo-sensitive layer formed thereon.

FIG. 2 is a depiction of an illustrative photo-sensitive layer 32 formed above a structure 30. Ultimately, an exposure process will be performed on at least a portion of the photo-sensitive layer 32. That is, at least a portion of the photo-sensitive layer 32 will be irradiated by a light source wherein light particles, as indicated by the arrows 35, are directed onto the photo-sensitive layer 32. Also depicted in FIG. 2 is an illustrative photon counter 38 that will be used for purposes to be described later in the application.

It should be understood that the photo-sensitive layer 32 and the structure 30 depicted in FIG. 2 are intended to be generic in nature. That is, the structure 30 may be any type of structure where it is desired to form a photo-sensitive layer 32 thereabove. For example, in the context of a semiconductor manufacturing application, the structure 30 may be a semiconducting wafer, a process layer, e.g., a layer of insulating material, a layer of metal, a layer of silicon, etc. Thus, the structure 30 depicted in FIG. 2 should be understood to be representative of any type of structure or layer wherein it is desired to form a layer of photo-sensitive material 32 on or above the layer 30. Similarly, the photo-sensitive layer 32 is intended to be representative of any type of photo-sensitive material that may be activated, i.e., have one or more physical properties of the layer changed, by exposure to a light source. In the context of semiconductor manufacturing operations, the photo-sensitive layer 32 may be a layer of photoresist material (positive or negative) that may be exposed by performing known photolithography processing techniques. Thus, the photo-sensitive layer 32 should not be considered as limited to any type of material unless such limitations are expressly set forth in the appended claims. Moreover, it should be understood that the layer of photo-sensitive material may be formed at any point during the manufacture of any type of device.

Typically, at least a portion of the photo-sensitive layer 32 is irradiated by the light 35 to change the physical characteristics of portions of the photo-sensitive layer 32 exposed to the photons in the light 35. In the context of semiconductor manufacturing operations, the photo-sensitive layer 32 may be a layer of photoresist that is selectively exposed to the light 35 through use of a patterned reticle in accordance with known techniques. It should be understood that the present invention may employ any type of light source generating any type of light, e.g., light waves, light particles, light rays, etc. Thus, the present invention should not be considered as limited to any particular type of light source or type of light used to irradiate the photo-sensitive layer 32 unless such limitations are expressly set forth in the appended claims.

Figure 3:
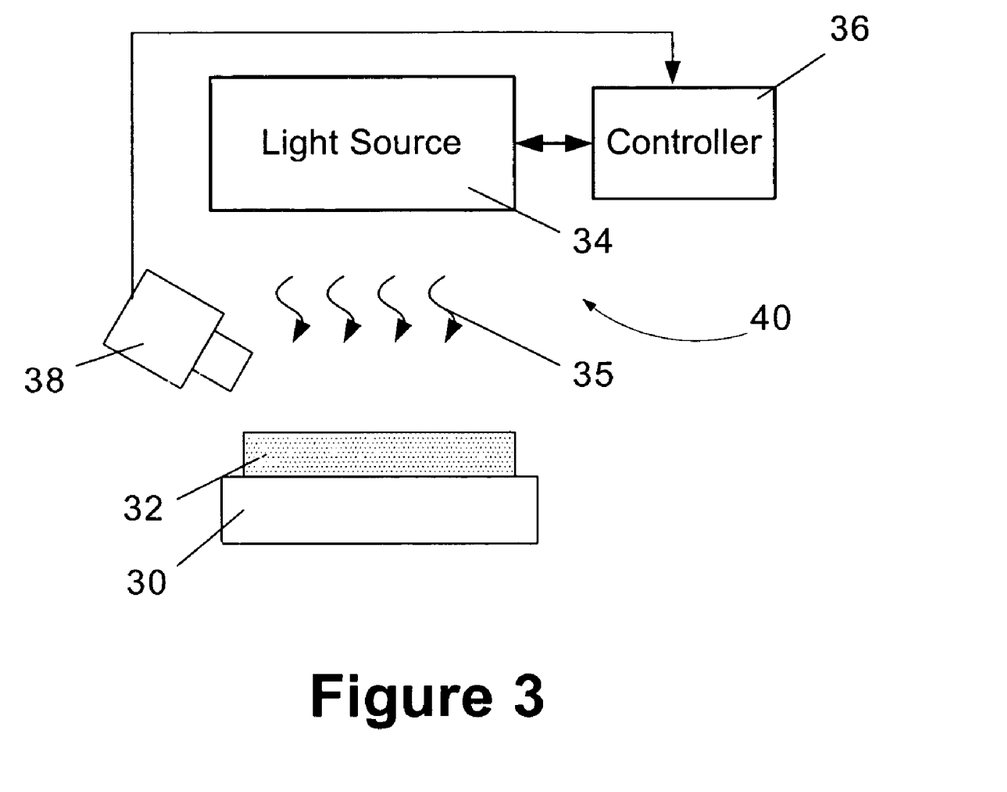
FIG. 3 depicts an illustrative embodiment of a system in accordance with one embodiment of the present invention.

FIG. 3 is a schematic depiction of an illustrative system 40 in accordance with one illustrative embodiment of the present invention. As shown therein, the system 40 is comprised of a light source 34, a controller 36 and a photon counter 38. In general, the light source 34 will be used to generate light 35 to expose at least a portion of the photo-sensitive layer 32 on the structure 30. The schematically depicted light source 34 is intended to be representative of any type of light source that may be used to irradiate the photo-sensitive layer 32. Moreover, the light source 34 may generate light in any desired wave length. In the illustrative example where the present invention is employed in a semiconductor manufacturing context, the light source 34 may be a light source that is capable of producing ultraviolet or deep-ultraviolet light to expose the photo-sensitive layer 32. However, the present invention may also be employed in situations where the light source 34 produces x-rays and/or electron beams to expose the photo-sensitive layer 32. Thus, the present invention should not be considered as limited to any particular type of light source unless such limitations are expressly set forth in the appended claims. For example, the light source may be a mercury lamp, a krypton/fluorine laser, etc.

The photon counter 38 may be any type of device that is capable of counting the number of photons and/or the rate of photons impacting all or a portion of the layer of photo-sensitive material. For example, the photon counter 38 may be a photo-multiplier tube (PMT) or other like device. Illustrative examples of photon counters and some applications of such photon counters are generally discussed in the following articles: Miller et al., "Demonstration of a low-noise near-infrared photon counter with multi-photon discrimination," *Applied Physics Letters*, 83:791–93, 2003), and Lui, "Minimum Line-Width Features for Cyrogenic Optical Photon Detectors," National Nanofabrication Users Network, Harvard University, both of which are hereby incorporated by reference in their entirety. U.S. Pat. Nos. 5,120,978 and 6,597,446 also disclose various photon detectors that may be employed in a variety of different applications. Both of the aforementioned patents are hereby incorporated by reference in their entirety. The photon counter 38 may be able to count the total number of photons incident on the layer of photo-sensitive material and/or the rate at which said photons impact the layer of photo-sensitive material. Moreover, although only a single photon counter 38 is depicted in FIG. 3, several such counters 38 may be employed depending upon the particular application. If desired, the photon counter 38 may be moved before, during or after the exposure process in an effort to increase the accuracy of the measurements taken and/or to account for spatial variations in the incident light, i.e., across-wafer variations due to degradation of the light source 34.

In the illustrated embodiments, the controller 36 is a computer programmed with software to implement the functions described herein. Moreover, the functions described for the controller 36 may be performed by one or more controllers spread through the system 40. For example, in the context of a semiconductor manufacturing application, the controller 36 may be a fab level controller that is used to control processing operations throughout all or a portion of a semiconductor manufacturing facility. Alternatively, the controller 36 may be a lower level computer that controls only portions or cells of the manufacturing facility. Moreover, the controller 36 may be a stand-alone device, or it may reside on a stepper or within a photolithography module. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Various illustrative examples of how the system 40 may be employed will now be discussed in the context of the situation where the present invention is employed in a semi-conductor manufacturing environment. However, as set forth previously, the present invention should not be considered as limited to such an application unless such limitations are expressly set forth in the appended claims. In the context of a semiconductor manufacturing application, the photo-sensitive layer 32 may be a layer of photoresist material formed above a structure 30, e.g., a process layer. Ultimately, the objective is to form a patterned masking layer above the structure layer 30. To that end, portions of the photo-sensitive layer 32, e.g., photoresist, are irradiated with light particles from the light source 34 using a variety of known photolithography techniques. Typically, this process involves projecting a light through a reticle that is scanned across the surface of a wafer to thereby expose portions of the layer of photoresist. During the exposure process, the photon counter 38 may be used to count the total number of photons that impact the photo-sensitive layer 32. More specifically, the photon counter 38 may be able to count the total number of photons impacting the photo-sensitive layer 32 within the field of observation of the photon counter 38. In addition to counting the total number of photons impacting the photo-sensitive layer 32, the rate at which photons impact the photo-sensitive layer 32 may also be determined through use of the photon counter 38. The photon counter 38 may or may not be able to sample the entirety of the photo-sensitive layer 32 exposed to the light source 34, depending upon the particular application. In that situation, the results obtained by the photon counter 38 may be assumed to substantially uniform across the surface of the photo-sensitive layer 32.

By counting the number of photons and/or rate of photons impacting the photo-sensitive layer 32, various control actions may be taken to insure proper exposure of the photo-sensitive layer 32. For example, the controller 36 may be used to control the duration of the exposure process and/or the irradiance (flow of energy per unit area per unit time; sometimes referred to as intensity) of the light source 34 during the processing of the measured wafer or on one or more subsequently process wafers. That is, based upon empirical data and/or known equations, the exposure process may be controlled by counting the total number of photons impacting the photo-sensitive layer 32. Additionally, control of the exposure process may be based upon the rate at which photons are impacting the photo-sensitive layer 32 as determined through use of the photon counter 38.

More specifically, in one illustrative example, the number of photons striking the photo-sensitive layer 32 may be correlated with the depth of exposure of the photo-sensitive layer 32. That is, based upon empirical data and/or known equations, the exposure depth of the layer of photo-sensitive material may be determined by knowing the number of photons striking the layer of photo-sensitive material. For example, the following known equations may be employed in connection with one illustrative application of the present invention:

$$I = \epsilon v(E^2) \qquad \text{Equation 1}$$

where:

I=irradiance $\epsilon$=dielectric constant of the medium the photons are propagating in v=frequency of light source E=optical field $$I = I_0 e^{(-\alpha z)} \qquad \text{Equation 2}$$

where:

I=irradiance $I_0$=irradiance at the surface of the irradiated object $\alpha$=optical absorption coefficient in a layer of photo-sensitive material z=direction of exposure of the photo-sensitive material In one illustrative example, the controller may employ equations similar to those above to determine or control the desired exposure of a layer of photo-sensitive material, e.g., photoresist. Even more specifically, in one particular example, the exposure process may be stopped after the counted number of photons exceeds a preselected limit, or the irradiance of the light may be increased or decreased after the photon counter reaches a threshold value. Of course, this would vary depending upon the type of photo-sensitive material employed in each application.

Thus, in one illustrative example, the present invention allows more precise control of the exposure process, thereby tending to prevent under-exposure or over-exposure situations which could occur using prior art methodologies whereby a standard exposure dose was applied to a photo-sensitive layer of material. The same rationale applies with respect to the rate at which photons impact the layer of photo-sensitive material 32. If the photon impact rate is determined, it may be integrated with the duration of the exposure process to determine the total number of photons striking the layer of photo-sensitive material 32.

Moreover, the present invention allows controllability with respect to the profile of the resulting features formed in the photo-sensitive layer 32 and ultimately in the underlying structure 30. For example, based upon empirical data and/or known equations, the total number of photons striking the photo-sensitive layer 32 may be correlated with a desired feature profile, e.g., gate electrode structures. Thus, by counting the total number of photons striking the photo-sensitive layer 32, more precise control of the profile of the features formed in the photo-sensitive layer 32 may be achieved. The same rationale applies with respect to the rate at which the photons impact the layer of photo-sensitive material 32.

In another illustrative application, the present invention may be employed to determine the degradation in irradiance of the light source over time. Based upon this determination, various control actions may be taken. For example, the duration of the exposure process may be increased based upon a determination that the irradiation of the light source is degrading or falling below preselected operating ranges. The irradiation of the light source may also be increased based upon a detected level of degradation in the light source. In this manner, the present invention may be used to compensate for degradation in irradiance thereby improving manufacturing efficiencies and avoiding wasteful rework situations.

Control equations may be employed to adjust the operating recipe of an illustrative photolithography tool or module (not shown) in situations where the methods described herein indicate that an adjustment is warranted. The control equations may be developed empirically using commonly known linear or non-linear techniques. The controller 36 may be part of a photolithography tool or module, and it may be used to control one or more aspects of the photolithography process, e.g., duration, light irradiance, etc. Through use of the present invention, manufacturing efficiencies with respect to the exposure of layers of photo-sensitive material may be achieved.

An exemplary software system capable of being adapted to perform the functions of the controller 36, as described, is the Catalyst system formerly offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is directed to various methods of controlling exposure processes by monitoring photon levels, and various systems for accomplishing same. In one illustrative embodiment, the method comprises performing an exposure process by generating light comprised of a number of photons from a light source to expose at least a portion of a layer of photo-sensitive material, counting a number of photons incident on at least a portion of the layer of photo-sensitive material, and controlling at least one of a duration of the exposure process and an irradiance of the light source based upon the counted number of photons.

In another illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, and controlling at least one of a duration of the exposure process and an irradiance of the light source based upon the determined rate of the photons impacting the layer of photo-sensitive material.

In yet another illustrative embodiment, the method comprises performing an exposure process by generating light comprised of a number of photons from a light source to expose at least a portion of a layer of photo-sensitive material, counting a number of photons incident on at least a portion of the layer of photo-sensitive material, determining at least one of a duration of the exposure process and an irradiance of the light source based upon the counted number of photons, and performing at least one additional exposure process on at least one additional layer of a photo-sensitive material using at least one of the determined duration of the exposure process and the irradiance of the light source.

In a further illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, determining at least one of a duration of the exposure process and an irradiance of the light source based upon the determined rate of the photons impacting the layer of photo-sensitive material, and performing at least one additional exposure process on at least one additional layer of a photo-sensitive material using at least one of the determined duration of the exposure process and the irradiance of the light source.

In a further illustrative embodiment, the method comprises performing an exposure process by generating light comprised of a number of photons from a light source to expose at least a portion of a layer of photo-sensitive material, counting a number of photons incident on at least a portion of the layer of photo-sensitive material, determining a degradation of the light source based upon the counted number of photons, and controlling at least one of a duration of the exposure process and an irradiance of the light source based upon the determined degradation of the light source. In some embodiments, the step of controlling at least one of a duration of the exposure process and an irradiance of the light source comprises stopping the exposure process after the determined degradation of the light source exceeds a preselected limit, increasing the irradiance of the light source, or increasing a duration of the exposure process.

In yet a further illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, determining a degradation of the light source based upon the determined rate of the photons impacting the layer of photo-sensitive material, and controlling at least one of a duration of the exposure process and an irradiance of the light source based upon the determined degradation of the light source.

In still a further illustrative embodiment, the method comprises performing an exposure process by generating light comprised of a number of photons from a light source to expose at least a portion of a layer of photo-sensitive material, counting a number of photons incident on at least a portion of the layer of photo-sensitive material, determining a degradation of the light source based upon the counted number of photons, determining at least one of a duration of the exposure process and an irradiance of the light source based upon the determined degradation of the light source, and performing at least one additional exposure process on at least one additional layer of a photo-sensitive material using at least one of the determined duration of the exposure process and the irradiance of the light source.

In yet another illustrative embodiment, the method comprises performing an exposure process by generating light comprised of a number of photons from a light source to expose at least a portion of a layer of photo-sensitive material, determining a rate at which the photons impact at least a portion of the layer of photo-sensitive material, determining a degradation of the light source based upon the determined rate of the photons impacting the layer of photo-sensitive material, determining at least one of a duration of the exposure process and an irradiance of the light source based upon the determined degradation of the light source, and performing at least one additional exposure process on at least one additional layer of a photo-sensitive material using at least one of the determined duration of the exposure process and the irradiance of the light source.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   performing an exposure process by generating light comprised of a number of photons from a light source to expose at least a portion of a layer of photo-sensitive material;
   counting a number of photons incident on at least a portion of said layer of photo-sensitive material; and
   controlling at least one of a duration of said exposure process and an irradiance of said light source based upon said counted number of photons.

2. The method of claim 1, wherein said light source is at least one of a deep-ultraviolet light, an ultraviolet light and an x-ray light.

3. The method of claim 1, wherein said light source is positioned in at least one of a stepper exposure tool and a phase scanner tool.

4. The method of claim 1, wherein said light source is comprised of at least one of a mercury lamp and a laser.

5. The method of claim 1, wherein said layer of photo-sensitive material is a layer of positive photoresist material.

6. The method of claim 1, wherein said layer of photo-sensitive material is a layer of negative photoresist material.

7. The method of claim 1, wherein said step of controlling at least one of a duration of said exposure process and an irradiance of said light source comprises stopping said exposure process after the number of said counted photons exceeds a preselected limit.

8. The method of claim 1, wherein said step of controlling at least one of a duration of said exposure process and an irradiance of said light source comprises increasing the irradiance of said light source.

9. The method of claim 1, wherein said step of controlling at least one of a duration of said exposure process and an irradiance of said light source comprises decreasing the irradiance of said light source.

10. A method, comprising:
    performing an exposure process by generating light comprised of a number of photons from a light source to expose at least a portion of a layer of photo-sensitive material;
    determining a rate at which said photons impact at least a portion of said layer of photo-sensitive material; and
    controlling at least one of a duration of said exposure process and an irradiance of said light source based upon said determined rate of said photons impacting said layer of photo-sensitive material.

11. The method of claim 10, wherein said light source is at least one of a deep-ultraviolet light, an ultraviolet light and an x-ray light.

12. The method of claim 10, wherein said light source is positioned in at least one of a stepper exposure tool and a phase scanner tool.

13. The method of claim 10, wherein said light source is comprised of at least one of a mercury lamp and a laser.

14. The method of claim 10, wherein said layer of photo-sensitive material is a layer of positive photoresist material.

15. The method of claim 10, wherein said layer of photo-sensitive material is a layer of negative photoresist material.

16. A method, comprising:
    performing an exposure process by generating light comprised of a number of photons from a light source to expose at least a portion of a layer of photo-sensitive material;
    counting a number of photons incident on at least a portion of said layer of photo-sensitive material;
    determining at least one of a duration of said exposure process and an irradiance of said light source based upon said counted number of photons; and
    performing at least one additional exposure process on at least one additional layer of a photo-sensitive material using at least one of said determined duration of said exposure process and said irradiance of said light source.

17. The method of claim 16, wherein said light source is at least one of a deep-ultraviolet light, an ultraviolet light and an x-ray light.

18. The method of claim 16, wherein said light source is positioned in at least one of a stepper exposure tool and a phase scanner tool.

19. The method of claim 16, wherein said light source is comprised of at least one of a mercury lamp and a laser.

20. The method of claim 16, wherein said layer of photo-sensitive material is a layer of positive photoresist material.

21. The method of claim 16, wherein said layer of photo-sensitive material is a layer of negative photoresist material.

22. The method of claim 16, wherein said step of determining at least one of a duration of said exposure process and an irradiance of said light source comprises stopping said exposure process after the number of said counted photons exceeds a preselected limit.

23. The method of claim 16, wherein said step of controlling at least one of a duration of said exposure process and an irradiance of said light source comprises increasing the irradiance of said light source.

24. The method of claim 16, wherein said step of controlling at least one of a duration of said exposure process and an irradiance of said light source comprises decreasing the irradiance of said light source.

25. A method, comprising:
    performing an exposure process by generating light comprised of a number of photons from a light source to expose at least a portion of a layer of photo-sensitive material;
    determining a rate at which said photons impact at least a portion of said layer of photo-sensitive material;
    determining at least one of a duration of said exposure process and an irradiance of said light source based upon said determined rate of said photons impacting said layer of photo-sensitive material; and
    performing at least one additional exposure process on at least one additional layer of a photo-sensitive material using at least one of said determined duration of said exposure process and said irradiance of said light source.

26. The method of claim 25, wherein said light source is at least one of a deep-ultraviolet light, an ultraviolet light and an x-ray light.

27. The method of claim 25, wherein said light source is positioned in at least one of a stepper exposure tool and a phase scanner tool.

28. The method of claim 25, wherein said light source is comprised of at least one of a mercury lamp and a laser.

29. The method of claim 25, wherein said layer of photo-sensitive material is a layer of positive photoresist material.

30. The method of claim 25, wherein said layer of photo-sensitive material is a layer of negative photoresist material.

31. A method, comprising:
performing an exposure process by generating light comprised of a number of photons from a light source to expose at least a portion of a layer of photo-sensitive material;
counting a number of photons incident on at least a portion of said layer of photo-sensitive material;
determining a degradation of said light source based upon said counted number of photons; and
controlling at least one of a duration of said exposure process and an irradiance of said light source based upon said determined degradation of said light source.

32. The method of claim 31, wherein said light source is at least one of a deep-ultraviolet light, an ultraviolet light and an x-ray light.

33. The method of claim 31, wherein said light source is positioned in at least one of a stepper exposure tool and a phase scanner tool.

34. The method of claim 31, wherein said light source is comprised of at least one of a mercury lamp and a laser.

35. The method of claim 31, wherein said layer of photo-sensitive material is a layer of positive photoresist material.

36. The method of claim 31, wherein said layer of photo-sensitive material is a layer of negative photoresist material.

37. The method of claim 31, wherein said step of controlling at least one of a duration of said exposure process and an irradiance of said light source comprises stopping said exposure process after said determined degradation of said light source exceeds a preselected limit.

38. The method of claim 31, wherein said step of controlling at least one of a duration of said exposure process and an irradiance of said light source comprises increasing the irradiance of said light source.

39. The method of claim 31, wherein said step of controlling at least one of a duration of said exposure process and an irradiance of said light source comprises increasing a duration of said exposure process.

40. A method, comprising:
performing an exposure process by generating light comprised of a number of photons from a light source to expose at least a portion of a layer of photo-sensitive material;
determining a rate at which said photons impact at least a portion of said layer of photo-sensitive material;
determining a degradation of said light source based upon said determined rate of said photons impacting said layer of photo-sensitive material; and
controlling at least one of a duration of said exposure process and an irradiance of said light source based upon said determined degradation of said light source.

41. The method of claim 40, wherein said light source is at least one of a deep-ultraviolet light, an ultraviolet light and an x-ray light.

42. The method of claim 40, wherein said light source is positioned in at least one of a stepper exposure tool and a phase scanner tool.

43. The method of claim 40, wherein said light source is comprised of at least one of a mercury lamp and a laser.

44. The method of claim 40, wherein said layer of photo-sensitive material is a layer of positive photoresist material.

45. The method of claim 40, wherein said layer of photo-sensitive material is a layer of negative photoresist material.

46. The method of claim 40, wherein said step of controlling at least one of a duration of said exposure process and an irradiance of said light source comprises stopping said exposure process after said determined degradation of said light source exceeds a preselected limit.

47. The method of claim 40, wherein said step of controlling at least one of a duration of said exposure process and an irradiance of said light source comprises increasing the irradiance of said light source.

48. The method of claim 40, wherein said step of controlling at least one of a duration of said exposure process and an irradiance of said light source comprises increasing a duration of said exposure process.

49. A method, comprising:
performing an exposure process by generating light comprised of a number of photons from a light source to expose at least a portion of a layer of photo-sensitive material;
counting a number of photons incident on at least a portion of said layer of photo-sensitive material;
determining a degradation of said light source based upon said counted number of photons;
determining at least one of a duration of said exposure process and an irradiance of said light source based upon said determined degradation of said light source; and
performing at least one additional exposure process on at least one additional layer of a photo-sensitive material using at least one of said determined duration of said exposure process and said irradiance of said light source.

50. The method of claim 49, wherein said light source is at least one of a deep-ultraviolet light, an ultraviolet light and an x-ray light.

51. The method of claim 49, wherein said light source is positioned in at least one of a stepper exposure tool and a phase scanner tool.

52. The method of claim 49, wherein said light source is comprised of at least one of a mercury lamp and a laser.

53. The method of claim 49, wherein said layer of photo-sensitive material is a layer of positive photoresist material.

54. The method of claim 49, wherein said layer of photo-sensitive material is a layer of negative photoresist material.

55. The method of claim 49, wherein said step of determining at least one of a duration of said exposure process and an irradiance of said light source comprises stopping said exposure process after said determined degradation of said light source exceeds a preselected limit.

56. The method of claim 49, wherein said step of controlling at least one of a duration of said exposure process and an irradiance of said light source comprises increasing the irradiance of said light source.

57. The method of claim 49, wherein said step of controlling at least one of a duration of said exposure process and an irradiance of said light source comprises increasing a duration of said exposure process.

58. A method, comprising:
performing an exposure process by generating light comprised of a number of photons from a light source to expose at least a portion of a layer of photo-sensitive material;

determining a rate at which said photons impact at least a portion of said layer of photo-sensitive material;

determining a degradation of said light source based upon said determined rate of said photons impacting said layer of photo-sensitive material;

determining at least one of a duration of said exposure process and an irradiance of said light source based upon said determined degradation of said light source; and performing at least one additional exposure process on at least one additional layer of a photo-sensitive material using at least one of said determined duration of said exposure process and said irradiance of said light source.

59. The method of claim 58, wherein said light source is at least one of a deep-ultraviolet light, an ultraviolet light and an x-ray light.

60. The method of claim 58, wherein said light source is positioned in at least one of a stepper exposure tool and a phase scanner tool.

61. The method of claim 58, wherein said light source is comprised of at least one of a mercury lamp and a laser.

62. The method of claim 58, wherein said layer of photo-sensitive material is a layer of positive photoresist material.

63. The method of claim 58, wherein said layer of photo-sensitive material is a layer of negative photoresist material.

64. The method of claim 58, wherein said step of controlling at least one of a duration of said exposure process and an irradiance of said light source comprises stopping said exposure process after said determined degradation of said light source exceeds a preselected limit.

65. The method of claim 58, wherein said step of controlling at least one of a duration of said exposure process and an irradiance of said light source comprises increasing the irradiance of said light source.

66. The method of claim 58, wherein said step of controlling at least one of a duration of said exposure process and an irradiance of said light source comprises increasing a duration of said exposure process.

* * * * *